United States Patent
Cuchiaro et al.

(10) Patent No.: US 6,225,656 B1
(45) Date of Patent: May 1, 2001

(54) FERROELECTRIC INTEGRATED CIRCUIT WITH PROTECTIVE LAYER INCORPORATING OXYGEN AND METHOD FOR FABRICATING SAME

(75) Inventors: Joseph D. Cuchiaro, Colorado Springs, CO (US); Akira Furuya, Tokyo (JP); Carlos A. Paz de Araujo, Colorado Springs, CO (US); Yoichi Miyasaka, Tokyo (JP)

(73) Assignees: Symetrix Corporation, Colorado Springs, CO (US); NEC Corporation (JP)

( * ) Notice: Subject to any disclaimer, the term of this patent is extended or adjusted under 35 U.S.C. 154(b) by 0 days.

(21) Appl. No.: 09/204,033

(22) Filed: Dec. 1, 1998

(51) Int. Cl.$^7$ ................................................. H01L 29/72
(52) U.S. Cl. ............................ 257/295; 257/632; 438/3; 438/758; 438/783
(58) Field of Search ................................. 257/295, 632; 438/3, 758, 783

(56) References Cited

U.S. PATENT DOCUMENTS

| | | | |
|---|---|---|---|
| 5,046,043 | * 9/1991 | Miller et al. | 257/295 |
| 5,434,102 | 7/1995 | Watanabe et al. . | |
| 5,439,845 | 8/1995 | Watanabe et al. . | |
| 5,471,363 | * 11/1995 | Mihara | 257/295 |
| 5,481,490 | 1/1996 | Watanabe et al. . | |
| 5,508,226 | 4/1996 | Ito et al. . | |
| 5,523,595 | * 6/1996 | Takenaka et al. | 257/295 |
| 5,554,559 | * 9/1996 | Wolters et al. | 257/295 |
| 5,591,663 | 1/1997 | Nasu et al. . | |
| 5,716,875 | 2/1998 | Jones, Jr. et al. . | |
| 5,784,310 | 7/1998 | Cuchiaro et al. . | |

OTHER PUBLICATIONS

H. Achard and H. Mace, "Integration Of Ferroelectric Thin Films For Memory Applications," Science and Technology of Electroceramic Thin Films, Kluwer Academic Publishers, p. 353–372, inclusive (1995).

Ilsub Chung et al., "Integration of Ferroelectric Capacitors Using Multilayered Electrode," The Tenth International Symposium on the Applications of Ferroelectrics, Rutgers University (Hilton Hotel, East Brunswick, NJ), p. 55 (Aug. 18, 1996).

Takashi Hase et al., "Analysis Of The Degradation of PZT and SrBi2Ta2O9 Thin Films With A Reductive Process," The Eighth International Symposium on Integrated Ferroelectrics, Plenary Talks, Invited Lectures and Contributed Papers (Tempe, AZ) (Mar. 18, 1996).

* cited by examiner

Primary Examiner—Edward Wojciechowicz
(74) Attorney, Agent, or Firm—Duft, Graziano & Forest, P.C.

(57) ABSTRACT

A protective layer in a ferroelectric integrated circuit contains small amounts of oxygen to protect ferroelectric oxide material against hydrogen degradation during the fabrication process. Typically, the protective layer is a hydrogen diffusion barrier layer formed to cover a thin film of ferroelectric oxide material. In one method, a small amount of oxygen is included in the sputter atmosphere during deposition of a hydrogen diffusion barrier or a metallized wiring layer. The oxygen forms oxides that inhibit diffusion of hydrogen towards the ferroelectric oxide material. The oxygen forms a concentration gradient so that the oxygen concentration in the interior of the protective layer is zero, and the oxygen concentration near the surfaces of the layer is about two weight percent.

46 Claims, 4 Drawing Sheets

FERROELECTRIC INTEGRATED CIRCUIT WITH PROTECTIVE LAYER INCORPORATING OXYGEN AND METHOD FOR FABRICATING SAME

BACKGROUND OF THE INVENTION

1. Field of the Invention

The invention relates to a ferroelectric integrated circuit having low sensitivity to hydrogen exposure and to a method for fabricating such a circuit.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possess desired electronic characteristics, such as high residual polarization, good coercive field, high fatigue resistance, and low leakage current. Lead-containing $ABO_3$-type ferroelectric oxides such as PZT (lead titanate zirconate) and PLZT (lanthanum lead titanate zirconate) have been studied for practical use in integrated circuits. Layered superlattice material oxides have also been studied for use in integrated circuits. See Watanabe, U.S. Pat. No. 5,434,102. Layered superlattice material compounds exhibit characteristics in ferroelectric memories that are orders of magnitude superior to those of PZT and PLZT compounds. Integrated circuit devices containing ferroelectric elements are currently being manufactured. Nevertheless, the persistent problem of hydrogen degradation during the manufacturing process hinders the economical production in commercial quantities of ferroelectric memories and other IC devices using the layered superlattice material compounds with the desired electronic characteristics.

A typical ferroelectric memory device in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a thin film containing ferroelectric metal oxide located between a first, bottom electrode and a second, top electrode, the electrodes typically containing platinum. During manufacture of the circuit, the MOSFET is subjected to conditions causing defects in the silicon substrate. For example, the CMOS/MOSFET manufacturing process usually includes high energy steps, such as ion-mill etching and plasma etching. Defects also arise during heat treatment for crystallization of the ferroelectric thin film at relatively high temperatures, often in the range 500°–900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a hydrogen annealing step, in which defects such as dangling bonds are eliminated by utilizing the reducing property of hydrogen. Various techniques have been developed to effect the hydrogen annealing, such as a forming-gas anneal ("FGA"). Conventionally, FGA treatments are conducted under ambient conditions in a $H_2$—$N_2$ gas mixture between 350° and 550° C., typically around 400–450° C., for a time period of about 30 minutes. In addition, the CMOS/MOSFET manufacturing process requires other fabrication steps that expose the integrated circuit to hydrogen, often at elevated temperatures, such as hydrogen-rich plasma CVD processes for depositing metals and dielectrics, growth of silicon dioxide from silane or TEOS sources, and etching processes using hydrogen and hydrogen plasma. During processes that involve hydrogen, the hydrogen diffuses principally through the top electrode to the ferroelectric thin film, but also from the side edges of the capacitor, and reduces the oxides contained in the ferroelectric material. The absorbed hydrogen also metallizes the surface of the ferroelectric thin film by reducing metal oxides. As a result of these effects, the electronic properties of the capacitor are degraded. After the forming-gas anneal (FGA), the remnant polarization of the ferroelectrics is very low and no longer suitable for storing information. An increase in leakage currents also results. In addition, the adhesivity of the ferroelectric thin film to the upper electrode is lowered by the chemical change taking place at the interface. Alternatively, the upper electrode is pushed up by the oxygen gas, water, and other products of the oxidation-reduction reactions taking place. Thus, peeling is likely to take place at the interface between the top electrode and the ferroelectric thin film. In addition, hydrogen also can reach the lower electrode, leading to internal stresses that cause the capacitor to peel off its substrate. These problems are acute in ferroelectric memories containing layered superlattice material compounds because these oxide compounds are particularly complex and prone to degradation by hydrogen-reduction.

A related problem encountered in the fabrication of ferroelectric devices is the stress arising in and between the different circuit layers as a result of the manufacturing processes. The ferroelectric compounds comprise metal oxides. The products of the reduction reactions cause an increase in the total volume of the ferroelectric element. As a result, the ferroelectric thin film exerts an upward pressure on the layers above it.

Several methods have been reported in the art to inhibit or reverse hydrogen degradation of desired electronic properties in ferroelectric oxide materials. Oxygen-recovery annealing at high temperature (800° C.) for about one hour results in virtually complete recovery of the ferroelectric properties degraded by hydrogen treatments. But the high-temperature oxygen-anneal itself might generate defects in silicon crystalline structure, thereby offsetting somewhat the positive effects of any prior forming-gas anneal on the CMOS characteristics. Also, a high-temperature oxygen-anneal may only be conducted prior to aluminum metallization. Furthermore, if hydrogen treatments have caused structural damage to the ferroelectric device, such as peeling, then a recovery anneal is not able to reverse effectively the damage.

To reduce the detrimental effects of the hydrogen heat treatment and protect the ferroelectric metal oxide element, the prior art also teaches the application of hydrogen barrier layers to inhibit the diffusion of hydrogen into the ferroelectric or dielectric material. The barrier layer is typically applied over the ferroelectric element, but it can also be applied below and to the sides of the element. Typically, hydrogen barrier layers are not completely effective in preventing hydrogen diffusion. Thus, even when a hydrogen diffusion barrier is used, it is not uncommon for structural damage to arise in the ferroelectric device and for hydrogen to reach the ferroelectric layer and degrade the ferroelectric properties of the ferroelectric material.

Therefore, it would be useful to have an integrated circuit with a ferroelectric memory device and a method for making such a circuit that would enhance the benefits of various measures used to protect ferroelectric oxide material, in particular, ferroelectric layered superlattice materials, from hydrogen degradation, while minimizing the complexity of the integrated circuit and its fabrication method.

3. Solution to the Problem

The invention solves the above problems by providing an integrated circuit in which at least one protective layer of a ferroelectric integrated circuit contains a small amount of oxygen. A protective layer can be a hydrogen barrier layer, a metallized wiring layer, or another layer or structural component of a ferroelectric integrated circuit. A ferroelectric integrated circuit according to the invention typically comprises a distinct hydrogen barrier layer containing a small amount of excess oxygen, or a metallized wiring layer containing a small amount of excess oxygen, or both. The invention also provides a method for forming a hydrogen barrier layer and a metallized wiring layer containing small amounts of oxygen. The small amount of oxygen in a protective layer according to the invention forms oxides to protect ferroelectric oxide material from hydrogen degradation. The oxides present in the protective layer protect ferroelectric oxides by reacting with hydrogen so that it does not diffuse into the ferroelectric material. In addition, the formation of the oxides in a hydrogen barrier layer directly over a ferroelectric circuit element exerts a compressive stress in a downward direction. The reduction of oxides by hydrogen in the ferroelectric material and other hydrogen reactions in the ferroelectric element cause stresses in the upward direction and can result in peeling of the thin films from the substrate. The compressive stress exerted by the hydrogen barrier layer in the downward direction as a result of oxide formation balances the upward stress exerted by the underlying ferroelectric thin film. The oxides in the hydrogen barrier layer thereby bring the capacitor stack into a stress equilibrium condition below catastrophic failure.

One aspect of the invention is the presence of small amounts of oxides near the surfaces of the protective layer. The oxides serve as "getters" of hydrogen. The small amount of oxides in the regions of the protective layer near its surfaces does not significantly decrease the electrical conductivity of the layer.

Preferably, the protective layer comprises a hydrogen barrier layer directly over a ferroelectric element. Preferably, the hydrogen barrier layer comprises a nitride of titanium or silicon if the hydrogen barrier layer is electrically conductive.

Another aspect of the invention is the presence of small amounts of oxides in metallized wiring layers directly over the ferroelectric element. The oxides are located in the regions near the surfaces of the metallized wiring layers.

Preferably, the metallized wiring layer comprises aluminum.

Another aspect of the invention is a protective layer containing a small amount of oxygen that covers the lateral side of a ferroelectric element.

A further aspect of the invention is the formation of a protective layer in such a manner that there is an oxygen gradient in the layers, with no oxygen present in the interior of the layers. Preferably, the concentration of oxygen is about two weight percent near the surfaces of the protective layer. Typically, the protective layer comprises a hydrogen barrier layer or a metallized wiring layer. If the protective layer comprises polycrystalline material with a plurality of crystal grains, such as a metal or ceramic material, then the small amount of oxygen is just enough to decorate the grain boundaries.

A further aspect of the invention is exertion of a downward stress by a hydrogen barrier layer containing a small amount of oxygen, caused by the oxides formed therein. The downward stress balances the upward stress exerted by the layers in the ferroelectric element as a result of hydrogen reactions.

A further aspect of the invention is a fabrication method in which small, varying amounts of oxygen are added to the sputtering gas atmosphere during sputter deposition of the protective layers so that oxygen is included in the regions near the surfaces of the layers, but not in the center region of the layers.

Numerous other features, objects and advantages of the invention will become apparent from the following description when read in conjunction with the accompanying drawings.

DETAILED DESCRIPTION OF THE PREFERRED EMBODIMENT

1. Overview and Description of Integrated Circuit

Figure 1:
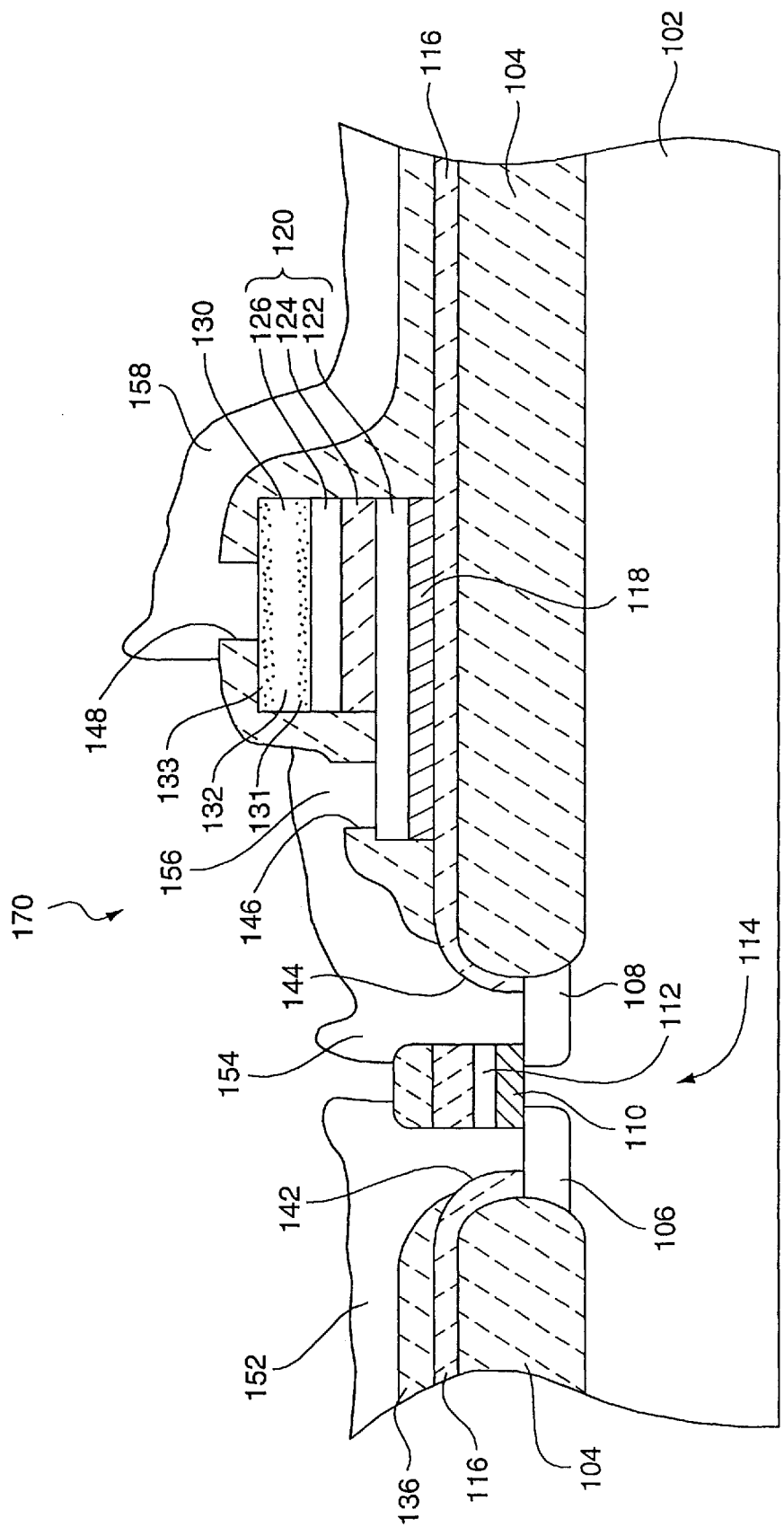
FIG. 1 is a cross-sectional view of an integrated circuit in accordance with the invention in which a stacked nonvolatile capacitor is capped by an electrically conductive hydrogen barrier layer containing small amounts of oxygen near its top and bottom surfaces.
Figure 2:
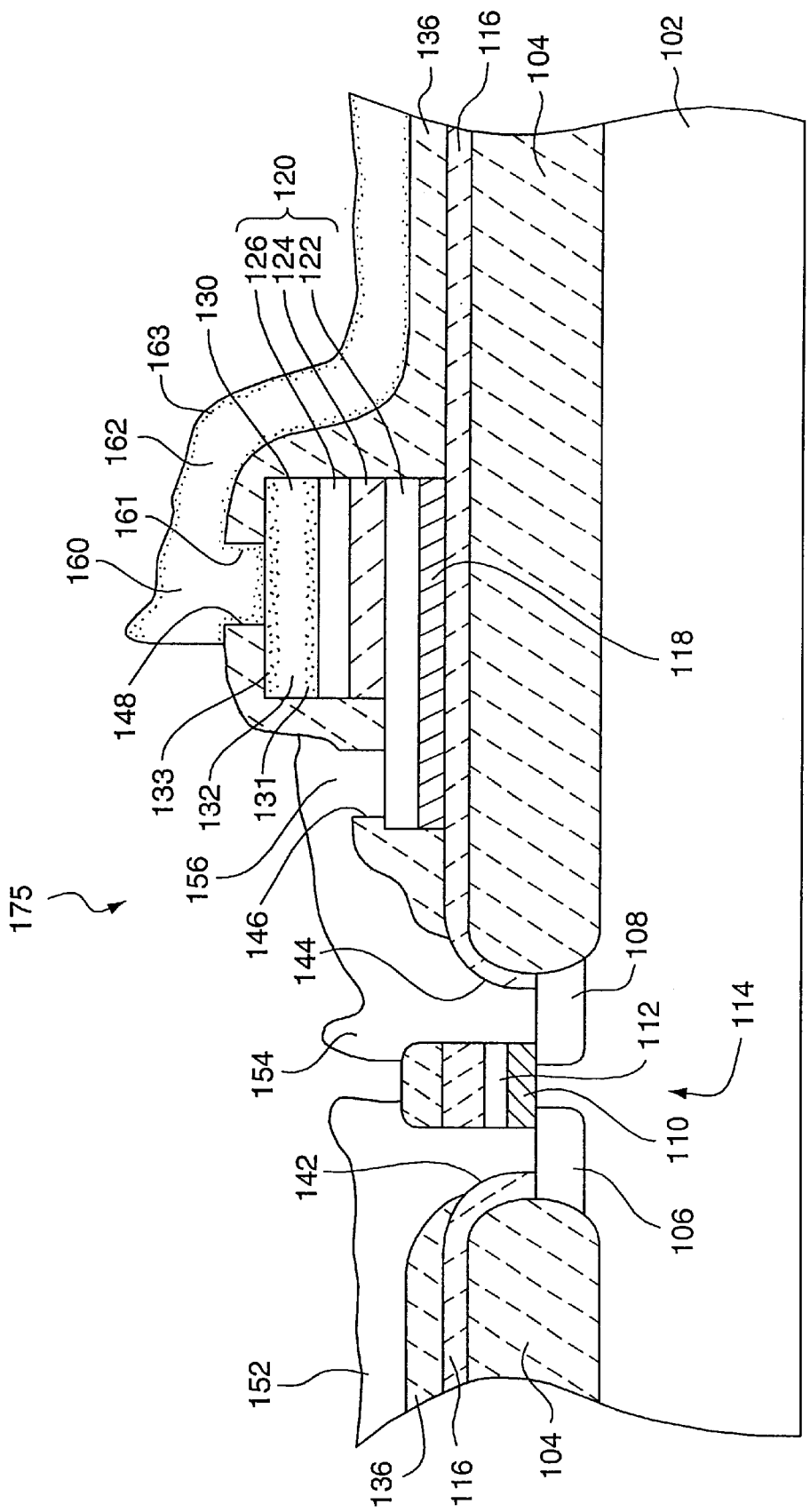
FIG. 2 is a cross-sectional view of an alternative embodiment of the invention, similar to the embodiment depicted in FIG. 1, but in which a metallized wiring layer contains small amounts of oxygen near its top and bottom surfaces.
Figure 3:
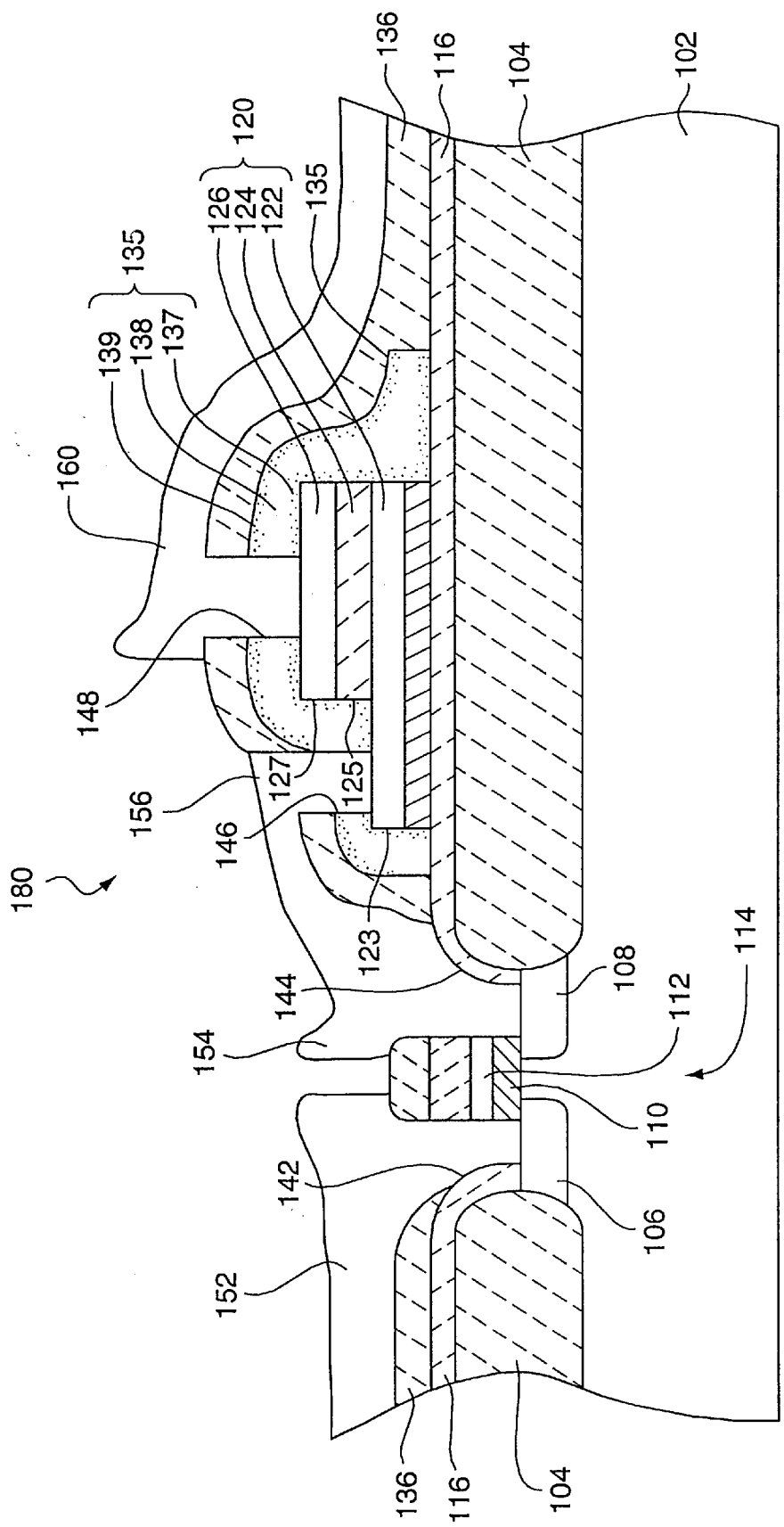
FIG. 3 is a cross-sectional view of an integrated circuit in accordance with an alternative embodiment of the invention in which the top and sides of a ferroelectric capacitor are covered by an electrically nonconductive hydrogen barrier layer containing small amounts of oxygen near its top and bottom surfaces.

It should be understood that the FIGS. 1–3 depicting ferroelectric integrated circuit devices are not meant to be actual plan or cross-sectional views of any particular portion of an actual integrated circuit device. In the actual devices, the layers will not be as regular and the thicknesses may have different proportions. The various layers in actual devices often are curved and possess overlapping edges. The figures instead show idealized representations which are employed to depict more clearly and fully the structure and process of the invention than would otherwise be possible. Also, the figures represent only one of innumerable variations of ferroelectric devices that could be fabricated using the method of the invention. FIGS. 1–3 depict a ferroelectric memory containing a switch in the form of a field effect transistor in electrical connection with a ferroelectric capacitor. But it would also be conceivable to use the method of this invention to fabricate a ferroelectric FET memory in which the ferroelectric element is incorporated in the switch element. Such a ferroelectric FET was described in McMillan, U.S. Pat. No. 5,523,964. Likewise, other integrated circuits fabricated using the method of the invention could include other elements and compositions of material.

In FIG. 1, there is shown a cross-sectional view of an exemplary nonvolatile ferroelectric memory cell 170 that could be fabricated according to the invention. The general manufacturing steps for fabricating integrated circuits containing MOSFETs and ferroelectric capacitor elements are described in Mihara, U.S. Pat. No. 5,466,629 and Yoshimori, U.S. Pat. No. 5,468,684, which are hereby incorporated by reference as if fully disclosed herein. General fabrication methods have been described in other references also.

Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 110 is formed on the silicon substrate 104 between the source and drain regions 106 and 108. Further, a gate electrode 112 is formed on the gate insulating layer 110. These source region 106, drain region 108, gate insulating layer 110, and gate electrode 112 together form a MOSFET 114.

A first interlayer dielectric layer (ILD) 116 made of BPSG (boron-doped phosphosilicate glass) is formed on substrate 104 and field oxide region 102. An adhesion layer 118 is formed on ILD 116. The adhesion layer 118 is made of, for example, titanium, and typically has a thickness of 200 Å. Adhesion layers, such as titanium, enhance the adhesion of the electrodes to adjacent underlying or overlying layers of the circuits.

As depicted in FIG. 1, a bottom electrode layer 122 made of platinum and having a thickness of 2000 Å is deposited on adhesion layer 118. Then a ferroelectric thin film 124 is formed on bottom electrode layer 122. A top electrode layer 126, made of platinum and having a thickness of 2000 Å, is formed on the ferroelectric thin film 124. The composition of the ferroelectric thin film 124 is discussed in more detail below.

A protective layer, in this case an electrically-conductive hydrogen barrier layer 130, is deposited on top electrode layer 126. Hydrogen barrier layer 130 preferably comprises a nitride of titanium. In accordance with the invention, hydrogen barrier layer 130 comprises small amounts of oxygen near its top and bottom surfaces. In FIG. 1, the dots depicted in lower region 131 near the bottom surface of layer 130 represent small amounts of oxygen. Similarly, the dots depicted in upper region 133 near the top surface of layer 130 represent small amounts of oxygen. Hydrogen barrier layer 130 preferably comprises crystalline grains. Preferably, there is a concentration gradient of oxygen in the hydrogen barrier layer 130, such that the concentration by weight of oxygen in the center region 132 of layer 130 is zero, and the oxygen concentration gradually increases to a value in the range from about one to three weight percent (1–3% wt.) in regions 131, 133 at the bottom and top surfaces of layer 130. Region 131 at the bottom of hydrogen barrier layer 130 extends from the bottom surface upward about 10–20% of the total thickness of layer 130. Similarly, region 133 at the top of hydrogen barrier layer 130 extends from the top surface downward about 10–20% of the total thickness of layer 130. Preferably, the oxygen concentration is about two percent (2%) by weight in regions 131, 133. The small amounts of oxygen are just enough to decorate the crystalline grain boundaries in the regions 131 and 133. It is believed that TiON located the grain boundaries increases the activation energy of grain boundary hydrogen diffusion, thereby inhibiting hydrogen diffusion through the layer. The small amounts of oxygen, however, do not substantially decrease the conductivity of the electrically conductive hydrogen barrier layer 130.

The stack of layers is then patterned in as few as two patterning steps to form a stacked memory capacitor 120 covered by a self-aligned hydrogen barrier 130. For example, as depicted in FIG. 1, portions of layers 124, 126, and 130 are etched away, down to the surface of layer 122. Then, portions of layers 122 and 118 are etched away, down to the surface of layer 116. These patterning steps result in formation of a stacked ferroelectric capacitor 120 covered by self-aligned hydrogen barrier layer 130.

A second interlayer dielectric layer (ILD) 136 made of NSG (nondoped silicate glass) is deposited to cover ILD 116, ferroelectric capacitor 120, and hydrogen barrier layer 130. A PSG (phospho-silicate glass) film or a BPSG (boron phospho-silicate glass) film could also be used in layer 136.

ILD 136 is patterned to form wiring holes for electrical contacts to MOSFET 114 and ferroelectric capacitor 120. Wiring hole 142 is selectively opened through ILD 136 and ILD 116 to expose the source region 106, and wiring hole 144 is selectively opened through ILD 136 and ILD 116 to expose the gate region 108. Wiring hole 146 is selectively opened through ILD 136 to expose a portion of the bottom electrode 122. Wiring hole 148 is selectively opened through ILD 136 to expose hydrogen barrier layer 130.

Source electrode wiring 152 and drain electrode wiring 154 are formed to fill wiring holes 142 and 144, respectively. Bottom electrode wiring 156 and top electrode wiring 158 are formed to fill the wiring holes 146 and 148, respectively. The drain electrode wiring 154 is electrically connected to bottom electrode wiring 156, and preferably is the same wiring element. Each of these wirings 152, 154, 156 and 158 preferably comprises Al—Si—Cu standard interconnect metal with a thickness of about 3000 Å.

Fabrication of the ferroelectric element, for example, the capacitor in FIG. 1, conventionally involves steps with oxidizing conditions that may damage the switch 114 and other elements of the integrated circuit. After the ferroelectric element has been formed, a hydrogen heat treatment of the circuit is usually performed to repair oxidation damage of the switch. During this hydrogen treatment, as well as during other high-energy steps, the ferroelectric properties of the ferroelectric thin film 124 are prone to degrade because hydrogen can diffuse into ferroelectric thin film 124 and react there with the ferroelectric oxides that the ferroelectric thin film 124 comprises. Generally, hydrogen diffusion barriers located directly over a ferroelectric element can inhibit hydrogen diffusion and thereby inhibit hydrogen-degradation of the ferroelectric oxides. Nevertheless, typical hydrogen diffusion barriers are not able to completely prevent hydrogen degradation of the ferroelectric oxides. The presence of small amounts of oxygen in hydrogen barrier layer 130 enhances the ability of hydrogen barrier layer 130 to inhibit hydrogen diffusion, and thereby enhances protection of the ferroelectric thin film 124.

FIG. 2 is a cross-sectional view of an alternative embodiment of the invention, similar to the embodiment depicted in FIG. 1, but in which a metallized wiring layer 160 of memory cell 175 contains small amounts of oxygen in lower region 161 near its bottom surface, and in upper region 163, near its top surface. Preferably, there is a concentration gradient of oxygen in the metallized wiring layer 160, such that the concentration by weight of oxygen in the center region 162 of layer 160 is zero, and the oxygen concentration gradually increases to a value in the range from about one to three weight percent (1–3% wt.) in regions 161, 163 near the bottom and top surfaces of layer 160. Preferably, the oxygen concentration is about two percent (2%) by weight in regions 161, 163. Region 161 at the bottom of metallized wiring layer 160 extends from the bottom surface upward about 10–20% of the total thickness of layer 160. Similarly, region 163 at the top of metallized wiring layer 160 extends from the top surface downward about 10–20% of the total thickness of layer 160. The small amounts of oxygen are just enough to decorate crystalline grain boundaries in regions 161 and 163. It is believed that TiON located at the material grain boundaries increases the activation energy of grain boundary hydrogen diffusion, thereby inhibiting hydrogen diffusion through the layer 160. The small amounts of oxygen, however, do not substantially decrease the conductivity of the metallized wiring layer 160. Preferably, metallized wiring layer 160 comprises aluminum. Preferably, the integrated circuit contains both a hydrogen barrier layer containing oxygen directly over the ferroelectric thin film, and a metallized wiring layer containing oxygen. But in one embodiment of the invention, the integrated circuit contains an oxygen-containing metallized wiring layer and no oxygen-containing hydrogen barrier layer, and in another embodiment, it contains an oxygen-containing hydrogen-barrier layer and no oxygen-containing metallized wiring layer. In still another embodiment, at least one structural layer or component of a ferroelectric integrated circuit that is not a metallized wiring layer or hydrogen barrier layer contains a small amount of excess oxygen.

In an alternative preferred embodiment, as shown in FIG. 3, electrically nonconductive hydrogen barrier layer 135 in ferroelectric memory cell 180 covers the top and sides of stacked capacitor 120. As depicted in FIG. 3, bottom electrode layer 122 has a lateral side 123; ferroelectric thin film 124 has a lateral side 125; and top electrode layer 126 has a lateral side 127. Lateral sides 123, 125 and 127 together form the sides of stacked capacitor 120. The portion of hydrogen barrier layer directly over ferroelectric thin film 124 prevents a significant portion of the hydrogen from diffusing vertically into the ferroelectric thin film through the top electrode layer 126. Yet some of the hydrogen that typically diffuses into a ferroelectric layer diffuses laterally from the edges of the layer. The portion of hydrogen barrier layer 135 covering lateral sides 123, 125 and 127 inhibits hydrogen diffusion in a lateral direction from the sides of capacitor 120 towards ferroelectric thin film 124. In accordance with the invention, hydrogen barrier layer 135 comprises small amounts of oxygen in lower region 137 near its bottom, interior surface, and in upper region 139 near its top, exterior surface. Region 137 at the bottom of hydrogen barrier layer 135 extends from the bottom surface upward about 10–20% of the total thickness of layer 135. Similarly, region 139 at the top of hydrogen barrier layer 135 extends from the top surface downward about 10–20% of the total thickness of layer 135. In FIG. 3, the dots depicted in regions 137 and 139 represent small amounts of oxygen. Hydrogen barrier layer 135 preferably comprises crystalline grains. Preferably, there is a concentration gradient of oxygen in the hydrogen barrier layer 135, such that the concentration by weight of oxygen in the center region 138 of layer 135 is zero, and the oxygen concentration gradually increases to a value in the range of from about one percent to three percent by weight (1–3% wt.) in regions 137, 139 at the surfaces of layer 135. Preferably, the concentration of oxygen in regions 137, 139 is about two weight percent (2% wt.) at the surfaces. In this embodiment, wiring holes 146 and 148 must be opened through electrically nonconductive hydrogen barrier layer 135 to make electrical contacts with ferroelectric capacitor 120. In another embodiment of the invention (not shown in the figures), an electrically nonconductive hydrogen barrier layer covers the sides of capacitor 120, while an electrically conductive hydrogen barrier layer is located directly over ferroelectric thin film 124.

The word "substrate" can mean the underlying wafer 102 on which the integrated circuit is formed, as well as any object on which a thin film layer is deposited, such as BPSG layer 116. In this disclosure, "substrate" shall mean the object to which the layer of interest is applied; for example, when we are talking about a bottom electrode, such as 122, the substrate includes the layers 118 and 116 on which the electrode 122 is formed.

The terms "above", "top" and "upper", and "below", "bottom" and "lower" herein, mean relative to the silicon substrate 102. That is, if a second element is "above" a first element, it means it is farther from the substrate 102; and if it is "below" another element, then it is closer to the substrate 102 than the other element. The long dimension of substrate 102 defines a plane that is considered to be a "horizontal" plane herein, and directions perpendicular to this plane are considered to be "vertical".

The term "protective layer" in this specification refers to a layer or other structural component of a ferroelectric integrated circuit that contains a small amount of oxygen to protect ferroelectric oxide material against hydrogen degradation. The term "protective layer" includes a hydrogen barrier layer containing small amounts of excess oxygen and a metallized wiring layer containing small amounts of excess oxygen. The term "hydrogen barrier layer" means a layer comprising material that is inherently a barrier to hydrogen diffusion, even if the layer contains no excess oxygen. For example, a layer comprising predominantly titanium nitride is a barrier to hydrogen diffusion, even if it contains no oxygen. The presence of small amounts of oxygen, however, enhances the diffusion barrier properties of titanium nitride.

This specification refers to a protective layer being formed directly over a thin film of ferroelectric material. By "directly over" is meant that the protective layer is above at least a portion of the ferroelectric thin film in the vertical direction in FIGS. 1–3. For example, in FIG. 1, the hydrogen barrier layer 130 is directly over ferroelectric thin film 124; it is also directly over bottom electrode layer 122, even though it is not above the portion of bottom electrode 122 in contact with wiring layer 156. The term "directly over" does not mean that the protective layer is in direct contact with the ferroelectric layer. The protective layer may or may not contact the ferroelectric layer. As long as it is directly over a portion of the ferroelectric layer, it will protect that portion from hydrogen diffusion. It is clear that ferroelectric elements can be fabricated with varying orientations relative to the horizontal and vertical. For example, if the ferroelectric thin film is in the vertical plane, then the word "lateral" would refer to the vertical direction, and "directly over" would refer to an orientation normal to the vertical plane of the thin film. The term "on" is often used in the specification when referring to the deposition or formation of an integrated circuit layer onto an underlying substrate or layer. In contrast to "directly over", the term "on" generally signifies direct contact, as is clear in the various contexts in which it is used.

The term "small amount" and similar terms are used in this specification to refer to oxygen contained in a thin film, layer or other structural component of an integrated circuit. "Small amount" means an amount of excess oxygen that does not exceed three weight percent (3% wt.) of the total weight of the designated thin film, layer or structural component. In this invention, the predominant material of the designated structural component typically does not comprise oxides or other oxygen containing compounds; for example, the predominant titanium nitride material in one type of hydrogen barrier layer. But if referring to a ferroelectric oxide layer, then "small amount" would mean an amount of oxygen in excess of the stoichiometrically balanced amount contained in the predominant ferroelectric oxide.

The term "thin film" is used herein as it is used in the integrated circuit art. Generally, it means a film of less than a micron in thickness. The thin films disclosed herein are in all instances less than 0.5 microns in thickness. Preferably, the ferroelectric thin films 124 are 1000 Å to 3000 Å thick, and most preferably 1200 Å to 2500 Å thick. These thin films of the integrated circuit art should not be confused with the layered capacitors of the macroscopic capacitor art which are formed by a wholly different process which is incompatible with the integrated circuit art.

The composition of the ferroelectric thin film 124 can be selected from a group of suitable ferroelectric oxide materials, including but not limited to: an $ABO_3$-type perovskite, such as a titanate (e.g., $BaTiO_3$, $SrTiO_3$, $PbTiO_3$ (PT), $PbZrTiO_3$ (PZT)), a niobate (e.g., $KNbO_3$), and, preferably, a layered superlattice compound.

U.S. Pat. No. 5,519,234 issued May 21, 1996, incorporated herein by reference, discloses that layered superlattice compounds, such as strontium bismuth tantalate, have excellent properties in ferroelectric applications as compared to the best prior materials and have high dielectric constants and low leakage currents. U.S. Pat. No. 5,434,102 issued Jul. 18, 1995 and U.S. Pat. No. 5,468,684 issued Nov. 21, 1995, incorporated herein by reference, describe processes for integrating these materials into practical integrated circuits.

The layered superlattice materials may be summarized generally under the formula:

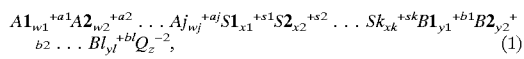

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-2}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound; or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the A-sites are occupied by strontium atoms and 25% of the A-sites are occupied by barium atoms. If there is only one A-site element in the compound, then it is represented by the "A1" element and w2 . . . wj all equal zero. If there is only one B-site site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include cases where either of the sites and the superlattice generator can have multiple elements. The value of z is found from the equation:

$$(a1w1+a2W2\ldots +ajwj)+(s1x1+s2x2\ldots +skxk)+(b1y1+b2y2\ldots +blyl)=2z. \quad (2)$$

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into the formula (1), but only those which spontaneously form themselves into crystalline structures with distinct alternating layers.

The word "compound" used precisely refers to a homogeneous substance in which the identical molecules all comprise the same chemical elements and structure. The term "material" may comprise molecules of different composition. For example, the layered superlattice material strontium bismuth tantalum niobate comprises interconnected crystal lattices in which two different kinds of atoms, tantalum and niobium, occupy variously the B-site positions of the crystal structure. Nevertheless, the terms "layered superlattice material", "layered superlattice compound", and "layered superlattice material compound" are used virtually interchangeably in this specification and their meaning is clear from the context.

The term "stoichiometrict" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2TaNbO_9$ and $SrBi_2Ta_{1.44}Nb_{0.56}O_9$ are balanced stoichiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stoichiometric" formula $SrBi_{2.18}Ta_{1.44}Nb_{0.56}O_9$, since it contains excess bismuth beyond what is needed to form a complete crystalline material. In this disclosure, an "excess" amount of a metallic element means an amount greater than required to bond with the other metals present to make the desired material, with all atomic sites occupied and no amount of any metal left over. However, as known in the art, because bismuth oxide is highly volatile and significant heat is used in fabricating electronic devices according to the invention, the molar proportion of bismuth in a solid ferroelectric thin film made according to the process of the invention will generally be less than that in the stoichiometric formula for the precursor. However, the molar proportions of strontium, tantalum, and niobium in ferroelectric thin film made according to the process of the invention will be very close or identical to the molar proportions given in the stoichiometric formula for the precursor. See U.S. Pat. No. 5,434,102 issued to Watanabe, et al.

It is known in the art that ferroelectric nonvolatile memories possessing good electronic properties are fabricated by forming a thin film of strontium bismuth tantalate material comprising chemical elements in proportions approximately represented by the stoichiometric formula $SrBi_2Ta_2O_9$. Based on the Watanabe, et al., U.S. Pat. No. 5,434,102 patent and related work, the precursor for making layered superlattice materials currently preferred by those skilled in the art has the stoichiometric formula $SrBi_{2.18}Ta_{1.44}Nb_{0.56}O_9$. It is believed that a precursor with this formula will result in a final solid strontium bismuth tantalum niobate thin film with the balanced stoichiometric formula $SrBi_{2.18}Ta_{1.44}Nb_{0.56}O_9$. That is, the final thin film does not contain excess bismuth because the excess bismuth in the precursor is carried away as bismuth oxide gas during the fabrication process. This precursor solution contains amounts of chemical precursors corresponding to the stoichiometric ratio $SrBi_{2.18}Ta_{1.44}Nb_{0.56}O_9$. This stoichiometric formula is referred to herein as the "standard" formula having the "standard" ratio of niobium to tantalum. A precursor having the standard stoichiometric formula includes about 9% excess bismuth. That is, the standard stoichiometric formula includes an amount of bismuth above what is required to bond with all the strontium, tantalum and niobium in the precursor to form a layered superlattice compound with all atomic sites in the crystal occupied. Preferably, ferroelectric layer 124 comprises layered superlattice material with excess B-site metal or excess superlattice generator metal; that is, amounts of at least one metal, such as bismuth and niobium, up to about forty mole-percent above or in addition to that shown in the standard formula. Such a ferroelectric material is more resistant to degradation by hydrogen than material made with a precursor having the standard formula.

2. Detailed Description of the Fabrication Process

Figure 4:
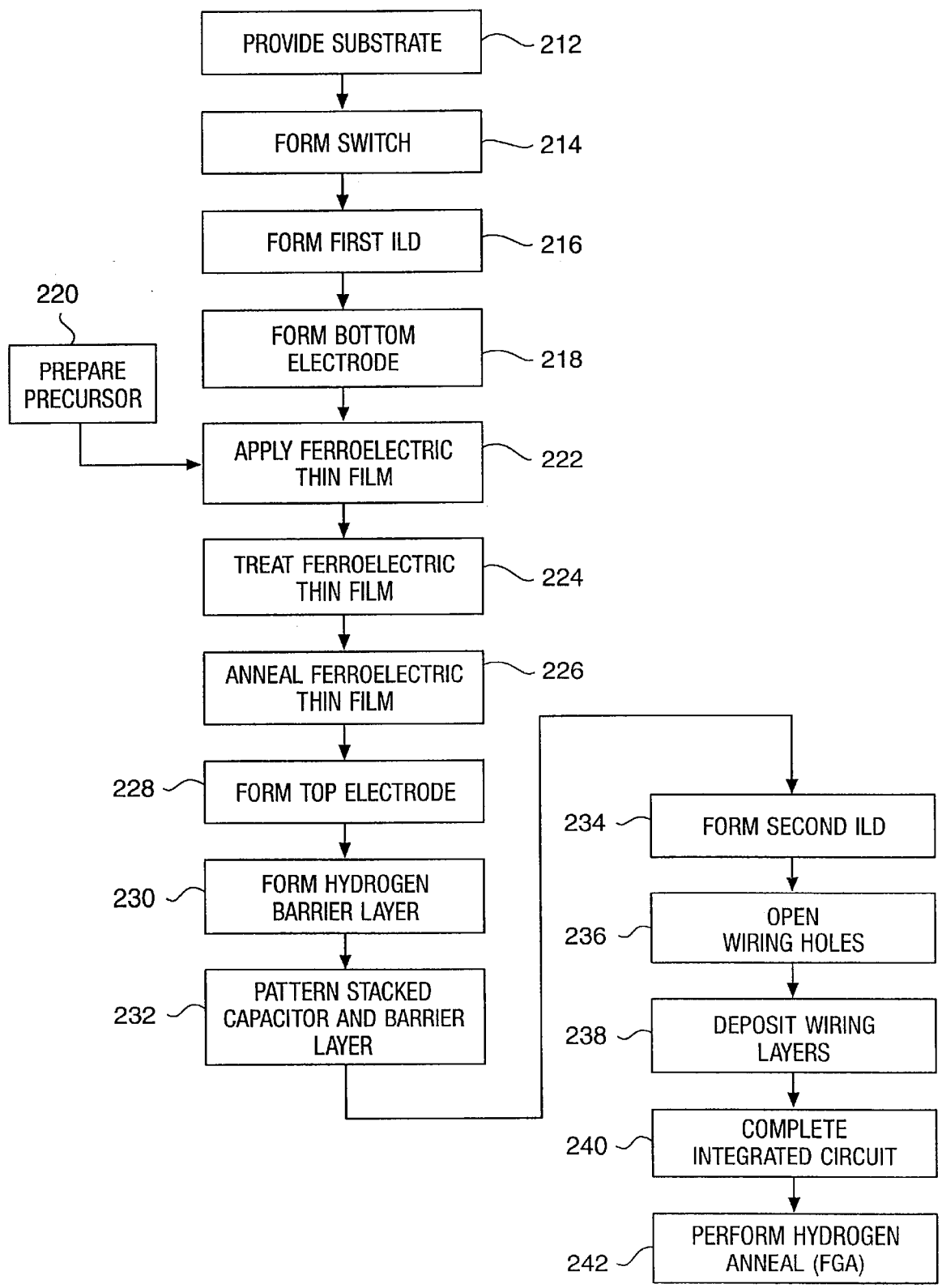
FIG. 4 is a flow chart showing a preferred embodiment of a process for fabricating a nonvolatile ferroelectric memory device according to the invention.

The diagram of FIG. 4 is a flow sheet of the fabrication steps in accordance with the invention to make a ferroelectric memory 170. The ferroelectric memory 170 is preferably formed on a conventional wafer that may be silicon, gallium arsenide or other semiconductor, or an insulator, such as glass or magnesium oxide (MgO). Ferroelectric memory 170 preferably comprises a protective layer that is a hydrogen barrier layer. In step 212, a semiconductor substrate 102 (FIG. 1) is provided on which a switch 114 is formed in step 214. The switch is typically a MOSFET. In step 216, a first interlayer dielectric layer 116 is formed to separate the switching element from the ferroelectric element to be formed. In step 218, a bottom electrode layer 122 is formed. Preferably, the electrode layer 122 is made of platinum and is sputter-deposited to form a layer with a thickness of about 2000 Å. in the preferred method, an adhesion layer 118 made of titanium or titanium nitride of about 200 Å would be formed in this step, preferably by sputtering, prior to depositing the electrode. In step 220, chemical precursors of the desired ferroelectric thin film are prepared. Preferably, the precursors contain compounds for forming ferroelectric layered superlattice materials. The ferroelectric thin film 124 is applied to the bottom electrode layer 122 in step 222. In the preferred method, the ferroelectric thin film contains layered superlattice compounds. A MOCVD method is the most preferred method to form the thin film. The ferroelectric thin films also can be applied using a liquid deposition technique, such as a spin-coating or a misted deposition method as described in U.S. Pat. No. 5,456,945. Usually, a final precursor solution is prepared from commercially available solutions containing the chemical precursor compounds. Preferably, the concentrations of the various precursors supplied in the commercial solutions are adjusted in step 220 to accommodate particular manufacturing or operating conditions. For example, the stoichiometric amounts of the various elements in a typical commercial solution for a layered superlattice thin film might be $SrBi_{2.18}Ta_{1.44}Nb_{0.56}O_9$. It is often desirable, however, to add extra niobium or bismuth to this solution to generate extra oxides that will protect the ferroelectric compounds from hydrogen degradation during reducing conditions. The application step 222 is preferably followed by a treatment process 224 which preferably includes a drying step and crystallization substeps at elevated temperatures, such as an oxygen furnace anneal and a rapid thermal process (RTP) anneal; treatment step 224 may include treatment with ultraviolet radiation during or after the application step 222. Steps 222 and 224 may be repeated as necessary to form a film of the desired thickness. For example, in a typical spin-on procedure, a coat of the precursor might be applied and dried. Then another precursor coat might be applied and dried. The treated film is then annealed in oxygen to form the resulting ferroelectric thin film 124 in step 226. Following steps 222–226, the top electrode layer 126 is formed in step 228. Preferably, top electrode layer 126 is made of platinum and is sputter-deposited to form a layer with a thickness of about 2000 Å. In step 230, hydrogen barrier layer 130 is deposited. Preferably, hydrogen barrier layer 130 comprises titanium nitride; preferably hydrogen barrier layer 130 is deposited on top electrode layer 126 by a sputtering process. It is a feature of the invention to include a small amount of $O_2$-gas (between zero and about ten volume percent) in the sputter atmosphere during the initial and latter time periods of the sputter-deposition of hydrogen barrier layer 130 in which regions 131 and 133 are formed. The resulting oxides that form in hydrogen barrier layer 130 protect the ferroelectric compounds in the memory device by reacting with the hydrogen that can be present in various manufacturing process steps or by inhibiting hydrogen diffusion. Preferably, step 230 is conducted such that there is a concentration gradient of oxygen in the hydrogen barrier layer 130, so that the concentration by weight of oxygen in the center region 132 of layer 130 is zero, and the oxygen concentration gradually increases to a value in the range from about one to three weight percent (1–3% wt.) in regions 131, 133 at the bottom and top surfaces of layer 130. Preferably, the oxygen concentration is about two percent (2%) by weight in regions 131, 133 near the surfaces.

Patterning steps via processes such as ion milling and ashing, as known in the art, are also included as appropriate in the fabrication of ferroelectric memory cell 170. For example, step 218 may include such a patterning step, and another such patterning step may follow step 226. Preferably, however, a plurality of layers are patterned in a single patterning step, such as in step 232. Barrier layer formation step 230 is preferably followed by a patterning process 232 in which the stacked layers 118, 122, 124, 126 and 130 are patterned to form ferroelectric capacitor 120, covered by self-aligning hydrogen barrier layer 130. Preferably, only two etching processes are required to complete the patterning process of step 232. Preferably, a conventional ion milling process is utilized in step 232. A second ILD layer 136 is then deposited in step 234 to cover ILD 116 and capacitor 120, including hydrogen barrier layer 130. In step 236, wiring holes 142, 144, 146, and 148 are made through the ILD layers 116 and 136, as depicted in FIGS. 1 and 2, to the switch 114 (typically to the source and drain regions of a MOSFET), to the bottom electrode 122, and to hydrogen barrier layer 130, respectively. Preferably, step 236 is performed using a standard ion milling process. In step 238, wiring layers 152, 154, 156, and 158 are deposited, as depicted in FIG. 1, preferably using a sputtering process. However, CVD processes can also be used, despite their accompanying reducing conditions, because hydrogen barrier layer 130 protects the ferroelectric oxides of thin film 124. In a preferred alternative embodiment of the inventive method, small amounts of oxygen are included in metallized wiring layer 160, which is directly over ferroelectric layer 120. Preferably, small amounts of oxygen are formed in metallized wiring layer 160 in upper region 161 near its top surface, and in upper region 163, near its bottom surface. Preferably, there is a concentration gradient of oxygen in the metallized wiring layer 160, such that the concentration by weight of oxygen in the center region 162 of layer 160 is zero, and the oxygen concentration gradually increases to a value in the range from about one to three weight percent (1–3% wt.) in regions 161, 163 near the bottom and top surfaces of layer 160. Preferably, the oxygen concentration is about two percent (2%) by weight in regions 161, 163. For example, in a sputter deposition process, small amounts of $O_2$-gas (between zero and ten volume percent) are added to the sputter gas atmosphere during formation of regions 161 and 163 of wiring layer 160 to form small amounts of aluminum oxide near the top and bottom surfaces of the layer 160.

Finally, hydrogen annealing is performed in step 240 to repair defects and restore desired semiconductor properties in the switch (MOSFET) 114. Preferably, the hydrogen anneal of the integrated circuit is conducted at atmospheric pressure in a $H_2$—$N_2$ (forming gas) gas mixture with one to ten percent (1–10%) $H_2$, at a temperature of between 2000 and 400° C. for a time duration of from 10 to 40 minutes. The circuit is completed in the step 242, which typically includes deposition of a passivation layer and packaging.

In an alternative preferred embodiment, as shown in FIG. 3, electrically nonconductive hydrogen barrier layer 135 of ferroelectric memory cell 180 is formed in step 230 to cover the top and sides of stacked capacitor 120. In accordance with the invention, small amounts of oxygen are formed in hydrogen barrier layer 135 in lower region 137 near its bottom interior surface, and in upper region 139 near its top, exterior surface. In FIG. 3, the dots depicted in regions 137 and 139 represent small amounts of oxygen. Preferably, a concentration gradient of oxygen is formed in the hydrogen barrier layer 135, such that the concentration by weight of oxygen in the center region 138 of layer 135 is zero, and the oxygen concentration gradually increases to a value in the range of from about one percent to three percent by weight (1–3% wt.) in regions 137, 139 at the surfaces of layer 135. Preferably, the concentration of oxygen in regions 137, 139 is about two weight percent (2% wt.) near the surfaces. In this embodiment, wiring holes 146 and 148 must be opened through electrically nonconductive hydrogen barrier layer 135 to make electrical contacts with ferroelectric capacitor 120.

Experiments have shown that lateral diffusion of the hydrogen through the ferroelectric thin film, that is, diffusion in a direction parallel to the plane of the ferroelectric thin film, is slow compared with diffusion in a direction normal to the plane of the ferroelectric film. It is, therefore, believed that extra oxides in the ferroelectric material at the lateral edges of the ferroelectric layer 124 act as a "getter" for any hydrogen that may penetrate in the lateral direction and protects the rest of the material from hydrogen. Ferroelectric thin film 124 preferably is formed to comprise excess oxides that "get" hydrogen which could otherwise cause hydrogen degradation in the remaining portions of the ferroelectric that are covered by a hydrogen barrier layer. Generally, the combination of one or more protective layers, such as oxygen-containing hydrogen barrier layer 130, 135, and excess oxides in ferroelectric thin film 124 is sufficient to protect the ferroelectric thin film 124 from significant degradation upon conventional hydrogen processes. However, depending on the intensity of the hydrogen exposure in the various hydrogenating and reducing steps in a fabrication process, use of additional protective measures can be helpful. For these reasons, the method of the invention contemplates the use of various other steps to protect the memory device from damage by hydrogen. These steps can be used in conjunction with oxygen-containing protective layers, such as hydrogen barrier layer 130, 135 and oxide-containing metallized wiring layer 160.

Other process sequences and steps may also be used. For example, holes for the MOSFET contact wiring can be opened before hydrogen treatment, while holes through the insulating layer to the electrodes of the ferroelectric element can be made after the hydrogen heat treatment step.

To keep the exposure to hydrogen small, a low-temperature, short-duration hydrogen heat treatment should be applied where possible. Also, good ferroelectric properties can be obtained by using precursors with excess metal, such as excess bismuth and/or excess niobium. Further, use of additional oxygen in integrated circuit layers laid down subsequent to the ferroelectric layers, such as an ILD layer laid down subsequent to the fabrication of the ferroelectric layer, which oxygen acts as a "getter" for hydrogen during subsequent hydrogen treatments, can also be effectively used either alone or in combination with one or more of the above measures. In this manner, the invention can be applied to processes and/or structures that enable the prevention of the degradation of ferroelectric elements in combination with almost any exposure to hydrogen that is necessary to create and perfect the other portions of the integrated circuit.

There has been described a method and structure for fabricating ferroelectric integrated circuits that permit exposure to hydrogen and still result in ferroelectric devices with good electrical properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. It is also evident that the steps recited may, in some instances, be performed in a different order; or equivalent structures and processes may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A ferroelectric integrated circuit comprising:
   an integrated circuit portion including a thin film of ferroelectric oxide material; and
   a protective layer located in a position to protect said ferroelectric oxide material from a reductive manufacturing process, said protective layer comprising oxygen forming an oxygen concentration gradient in said protective layer.

2. A ferroelectric integrated circuit as in claim 1, wherein said protective layer comprises a lower region, a center region and an upper region such that said center region has an oxygen concentration of zero, and said lower region has an oxygen concentration in a range from one to three weight percent, and said upper region has an oxygen concentration in a range from one to three weight percent.

3. A ferroelectric integrated circuit as in claim 2, wherein said concentration of oxygen in said lower and upper regions is about two weight percent.

4. A ferroelectric integrated circuit as in claim 1, wherein protective layer is a hydrogen barrier layer.

5. A ferroelectric integrated circuit as in claim 4, wherein said hydrogen barrier layer is directly over said thin film of ferroelectric oxide material.

6. A ferroelectric integrated circuit as in claim 4, wherein said hydrogen barrier layer is electrically conductive.

7. A ferroelectric integrated circuit as in claim 4, wherein said thin film of ferroelectric oxide material and said hydrogen barrier layer are self-aligning.

8. A ferroelectric integrated circuit as in claim 4, wherein said hydrogen barrier layer comprises a nitride of titanium.

9. A ferroelectric integrated circuit as in claim 4, wherein said hydrogen barrier layer comprises a nitride of silicon.

10. A ferroelectric integrated circuit as in claim 1, wherein said thin film of ferroelectric oxide material comprises ferroelectric layered superlattice material.

11. A ferroelectric integrated circuit as in claim 10, wherein said ferroelectric layered superlattice material comprises strontium bismuth tantalum niobate.

12. A ferroelectric integrated circuit as in claim 10, wherein said ferroelectric layered superlattice material comprises strontium bismuth tantalate.

13. A ferroelectric integrated circuit as in claim 1, wherein said protective layer comprises a metallized wiring layer.

14. A ferroelectric integrated circuit as in claim 13, wherein said metallized wiring layer comprises aluminum.

15. A ferroelectric integrated circuit as in claim 1, wherein said thin film of ferroelectric oxide material has a lateral side, and said protective layer covers said lateral side.

16. A ferroelectric integrated circuit as in claim 15, wherein said protective layer comprises a lower region, a center region and an upper region such that said center region has an oxygen concentration of zero, and said lower region has an oxygen concentration in a range from one to three weight percent, and said upper region has an oxygen concentration in a range from one to three weight percent.

17. A ferroelectric integrated circuit as in claim 16, wherein said concentration of oxygen in said lower and upper regions is about two weight percent.

18. A ferroelectric integrated circuit as in claim 15, wherein said protective layer comprises a hydrogen barrier layer.

19. A ferroelectric integrated circuit as in claim 15, wherein said thin film of ferroelectric oxide material comprises ferroelectric layered superlattice material.

20. A ferroelectric integrated circuit comprising:
   a substrate;
   a bottom electrode layer on said substrate;
   a thin film of ferroelectric oxide material on said bottom electrode;
   a top electrode layer on said ferroelectric material; and
   a protective layer located in a position to protect said ferroelectric oxide material from a reductive manufacturing process, said protective layer comprising oxygen forming an oxygen concentration gradient in said protective layer.

21. A ferroelectric integrated circuit as in claim 20, wherein said bottom electrode layer has a lateral side, said thin film of ferroelectric oxide material has a lateral side, and said top electrode layer has a lateral side, and said protective layer covers said lateral sides.

22. A ferroelectric integrated circuit as in claim 21, wherein said protective layer comprises a lower region, a center region and an upper region such that said center region has an oxygen concentration of zero, and said lower region has an oxygen concentration in a range from one to three weight percent, and said upper region has an oxygen concentration in a range from one to three weight percent.

23. A ferroelectric integrated circuit as in claim 22, wherein said concentration of oxygen in said lower and upper regions is about two weight percent.

24. A method for fabricating a ferroelectric integrated circuit comprising the steps of:
   forming an integrated circuit portion including a thin film of ferroelectric oxide material; and
   forming a protective layer in a position to protect said ferroelectric oxide material from a reductive manufacturing process;
   wherein said step of forming a protective layer includes forming an oxygen gradient in said protective layer.

25. A method as in claim 24, wherein said protective layer comprises a lower region, a center region and an upper region such that said center region has an oxygen concentration of zero, and said lower region has an oxygen concentration in a range from one to three weight percent, and said upper region has an oxygen concentration in a range from one to three weight percent.

26. A method as in claim 25, wherein said concentration of oxygen in said lower and upper regions is about two weight percent.

27. A method as in claim 24, wherein said protective layer is a hydrogen barrier layer.

28. A method as in claim 27, wherein said hydrogen barrier layer is directly over said thin film of ferroelectric oxide material.

29. A method as in claim 27, wherein said hydrogen barrier layer is electrically conductive.

30. A method as in claim 27, further comprising patterning together said thin film of ferroelectric oxide material and said hydrogen barrier layer.

31. A method as in claim 27, wherein said hydrogen barrier layer comprises a nitride of titanium.

32. A method as in claim 27, wherein said hydrogen barrier layer comprises a nitride of silicon.

33. A method as in claim 24, wherein said thin film of ferroelectric oxide material comprises ferroelectric layered superlattice material.

34. A method as in claim 33, wherein said ferroelectric layered superlattice material comprises strontium bismuth tantalum niobate.

35. A method as in claim 33, wherein said ferroelectric layered superlattice material comprises strontium bismuth tantalate.

36. A method as in claim 24, wherein said protective layer comprises a metallized wiring layer.

37. A method as in claim 36, wherein said metallized wiring layer comprises aluminum.

38. A method as in claim 24, wherein said thin film of ferroelectric oxide material has a lateral side, and said protective layer is formed on said lateral side.

39. A method as in claim 38, wherein said protective layer comprises a lower region, a center region and an upper region such that said center region has an oxygen concentration of zero, and said lower region has an oxygen concentration in a range from one to three weight percent, and said upper region has an oxygen concentration in a range from one to three weight percent.

40. A method as in claim 39, wherein the concentration of oxygen in said lower and upper regions is about two weight percent.

41. A method as in claim 38, wherein said protective layer comprises a hydrogen barrier layer.

42. A method as in claim 38, wherein said thin film of ferroelectric oxide material comprises ferroelectric layered superlattice material.

43. A method for fabricating a ferroelectric integrated circuit comprising:

forming a substrate;

forming a bottom electrode layer on said substrate;

forming a thin film of ferroelectric oxide material on said bottom electrode;

forming a top electrode layer on said ferroelectric material;

forming a protective layer in a position to protect said ferroelectric oxide material from a reductive manufacturing process;

wherein said step of forming a protective layer comprises forming an oxygen gradient in said protective layer.

44. A method as in claim 43, wherein said bottom electrode layer has a lateral side, said thin film of ferroelectric oxide material has a lateral side, and said top electrode layer has a lateral side, and said protective layer covers said lateral sides.

45. A method as in claim 44, wherein said protective layer comprises a lower region, a center region and an upper region such that said center region has an oxygen concentration of zero, and said lower region has an oxygen concentration in a range from one to three weight percent, and said upper region has an oxygen concentration in a range from one to three weight percent.

46. A method as in claim 45, wherein the concentration of oxygen in said lower and upper regions is about two weight percent.

* * * * *